United States Patent [19]

Parsons

[11] 4,133,919
[45] Jan. 9, 1979

[54] METHOD OF MAKING DECORATIVE PANELS

[76] Inventor: Robert C. Parsons, 8003 Inwood Rd., Dallas, Tex. 75209

[21] Appl. No.: 841,454

[22] Filed: Oct. 12, 1977

Related U.S. Application Data

[62] Division of Ser. No. 677,363, Apr. 15, 1976, Pat. No. 4,093,754.

[51] Int. Cl.² .............................................. B05D 5/00
[52] U.S. Cl. ...................................... 427/259; 96/36.4; 101/128.3; 427/264; 427/266; 427/269; 427/270; 427/272; 427/282; 427/287; 427/348; 51/310; 51/319
[58] Field of Search ........................ 96/36.4; 101/128.3; 51/262.1, 310, 311, 312, 319, 320, 321; 427/259, 264, 266, 269, 270, 272, 282, 287, 348

[56] References Cited

U.S. PATENT DOCUMENTS

| | | | |
|---|---|---|---|
| 1,784,495 | 12/1930 | O'Neil | 51/311 |
| 1,869,695 | 8/1932 | Jellow et al. | 51/311 |
| 2,358,710 | 9/1944 | Helgeson | 51/311 X |
| 3,507,740 | 4/1970 | Gaspari | 51/311 X |
| 3,579,926 | 5/1971 | Gaspari | 51/311 X |

Primary Examiner—Michael R. Lusignan
Attorney, Agent, or Firm—Richards, Harris & Medlock

[57] ABSTRACT

In a method of making decorative panels, a liquid masking material is applied to a surface of a panel, and is cured to form a substantially solid masking layer on the surface. A pattern comprising at least one unmasked area and at least one masked area is formed in the masking layer either simultaneously with the application of the liquid masking material or subsequent to the curing step. The surface of the panel is then treated to render the unmasked areas of the surface of the panel visually distinguishable from the masked areas. In one embodiment of the invention the masking layer is elastomeric and the surface of the panel is treated by sandblasting, after which the masking layer is removed. The entire process may then be repeated to provide a dual density effect. In another embodiment of the invention an asphaltum masking layer is applied to a mirror forming layer on a panel, after which the portions of the mirror forming layer corresponding to the unmasked areas are chemically removed.

3 Claims, 8 Drawing Figures

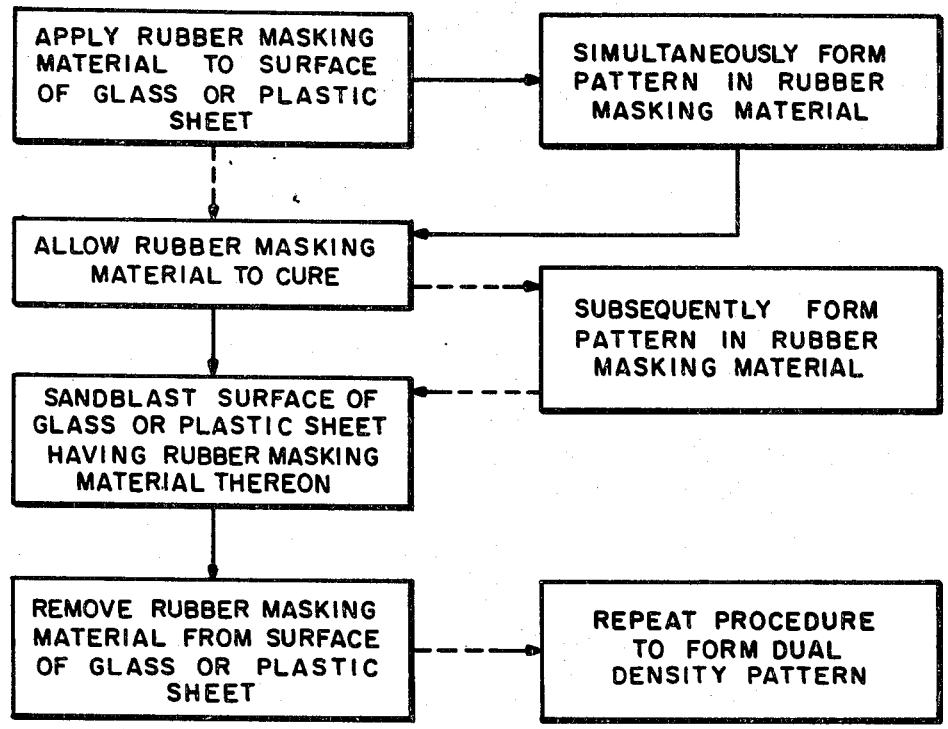
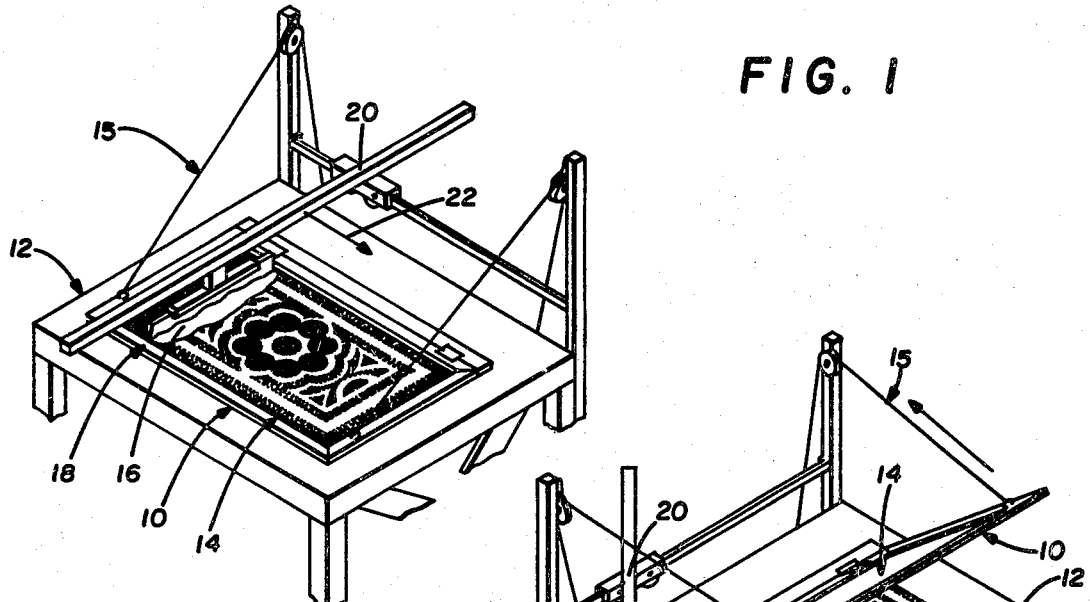
FIG. 1
FIG. 2
FIG. 3

METHOD OF MAKING DECORATIVE PANELS

This is a division of application Ser. No. 677,363, filed Apr. 15th, 1976, now U.S. Pat. No. 4,093,754, patented June 6, 1978.

BACKGROUND AND SUMMARY OF THE INVENTION

This invention relates to a method of making decorative panels, and more particularly to a method of making large glass or plastic panels having the appearance of etched glass panels.

At the present time many restaurants, taverns, and similar establishments are decorated in antique or period motifs. Such a decor typically involves the use of antique or antique-type bars, back bars, ceiling panels, furniture, signs and other wall hangings of various types, etc. In many instances transparent or mirrored panels having the appearance of etched glass panels are employed, either in a purely decorative mode or in a functional mode, for example as room dividers or the like.

Since there is obviously an insufficient supply of authentic antique etched glass panels to fulfill current requirements, a need exists for the manufacture of new transparent and mirrored panels having the appearance of antique etched glass panels. It will be understood that it is still possible to make panels of this type by means of the prior art technique of etching glass surfaces with hydroflouric acid. However, the prior art technique is both time consuming and exacting, with the result being that panels produced in accordance with the prior art technique are prohibitively costly.

The present invention comprises a method of making decorative panels which overcome the foregoing and other difficulties long since associated with the prior art. In accordance with the broader aspects of the invention, a liquid masking material is applied to a surface of a panel and is cured to form a substantially solid masking layer. Either simultaneously with the application of the liquid masking material or subsequent to the curing step, a pattern comprising at least one unmasked area and at least one masked area is formed in the masking layer. Subsequently the surface of the panel having the masking layer thereon is treated, whereby the unmasked areas of the surface of the panel are rendered visually distinguishable from the masked areas. In this manner both transparent and mirrored panels having the appearance of etched glass panels may be economically manufactured.

In accordance with more specific aspects of the invention, glass or plastic panels which may be either transparent or mirrored are fabricated utilizing an elastomeric masking material. The pattern may be formed in the elastomeric masking material simultaneously with the application of the liquid elastomeric masking material, such as by applying the material through a screen. Alternatively, the pattern may be formed in the elastomeric masking material after the material has been applied and cured, such as by mechanically removing portions of the cured elastomeric masking layer.

In accordance with this embodiment of the invention, the unmasked areas of the surface of the panel are rendered visually distinguishable by impinging a high velocity stream of particulate material onto the surface of the panel having the masking layer thereon. Both the velocity of the stream and the duration of the application of the stream to the surface of the panel may be controlled to regulate the degree to which the unmasked areas are rendered visually distinguishable. The masking layer is then removed to provide a panel on which the previously unmasked areas have an etched appearance and the previously masked areas have a non-etched appearance. The entire procedure may be repeated utilizing a different pattern to provide a dual density visual effect on the surface of the panel.

In accordance with another embodiment of the invention, mirrored plastic panels may be fabricated utilizing an asphaltum masking material. The liquid asphaltum masking material is applied to a mirror forming layer on the panel, and the pattern in the adhesive layer may be formed simultaneously with the application thereof to the panel, such as by applying the material through a screen. Alternatively, the pattern may be formed after the asphaltum masking material has been applied to the panel and cured, such as by mechanically removing portions of the masking layer.

The portions of the mirror forming layer on the panel corresponding to the unmasked areas are subsequently removed by chemically dissolving the mirror forming layer utilizing an etching material. The mirror forming layer, the asphaltum masking material and the etching material are then sprayed with silver paint. By this means there is provided a mirrored plastic panel having the appearance of an etched or frosted glass mirror.

DESCRIPTION OF THE DRAWINGS

A more complete understanding of the invention may be had by reference to the following Detailed Description when taken in conjunction with the accompanying drawings, wherein:

FIG. 1 is a flow chart illustrating a method of making decorative panels comprising a first embodiment of the invention;

FIGS. 2, 3, 4 and 5 are illustrations of various steps in the method comprising a first embodiment;

DETAILED DESCRIPTION

Figure 4:
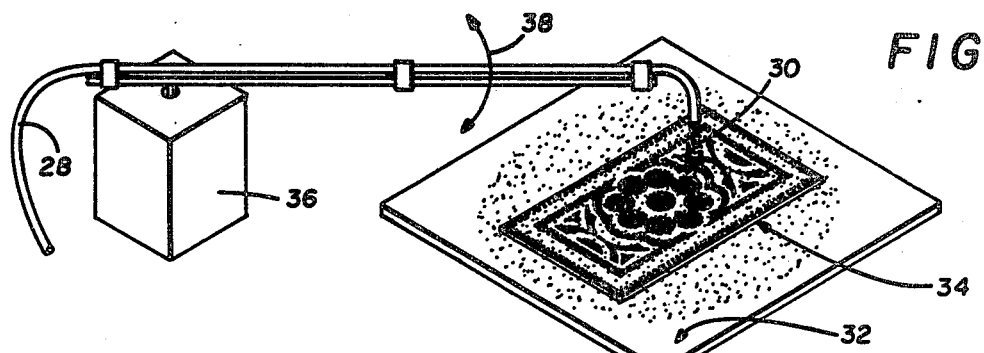

Referring now to the Drawings, and particularly to FIG. 1 thereof, a method of making decorative panels incorporating the invention is illustrated. FIG. 1 illustrates a method of making decorative panels incorporating a first embodiment of the invention. In accordance with the first embodiment, a rubber masking material is employed. As used herein the term rubber includes various elastomeric materials including materials not strictly definable as rubber.

The first step in the practice of the method comprising the first embodiment of the invention involves preparing the rubber masking material. The rubber masking material is preferably of the type sold by Dow Corning Corporation under the trademark "SILASTIC", it being understood that similar materials sold by other manufacturers under other trademarks may also be employed in the practice of the invention. The preparation of the rubber masking material is in accordance with the manufacturer's directions, and typically involves the mixing of a polymerizing agent or initiator with a quantity of unpolymerized elastomeric material. The mixing ratios for the two materials and the mixing time that is necessary in order to form the two materials into the rubber masking material depend on the particular type of material that is utilized.

After the rubber masking material has been prepared it is applied to a surface of a sheet of glass or plastic material. Sheets formed from various types of glass may be utilized in the practice of the invention. Likewise, sheets formed from various types of plastic may be utilized in the practice of the invention. One type of plastic material which has been successfully utilized in the practice of the invention comprises a material sold by Rohn & Haas Co. under the trademark "PLEXI-GLASS". The invention may be practiced utilizing glass or plastic sheets which are either mirrored or transparent, in accordance with particular requirements.

The rubber masking material is preferably applied to the surface of the glass or plastic sheet in accordance with a predetermined pattern. In such instances the predetermined pattern is formed in a screen prior to the preparation of the rubber masking material. The screen may be of the type that is utilized in the printing industry for silk screen-type printing, it being understood that the mesh size of the screen must be selected to allow the rubber masking material to flow therethrough.

The screens that are utilized in the practice of the present invention may be prepared in the same manner that screens are prepared for silk screen-type printing. Thus, the screen may be covered with a photosensitive emulsion which is subsequently exposed photographically. Thereafter the exposed emulsion is developed. In this manner the screen is divided into portions which will allow the rubber masking material to flow therethrough and portions which will prevent the rubber masking material from flowing therethrough.

In the practice of the invention, the thus prepared screen is positioned immediately adjacent the surface of the sheet that is to receive the rubber masking material. The rubber masking material is then applied to the screen, and a squeegee or similar tool is utilized to force the rubber masking material through the appropriate areas of the screen. In this manner the rubber masking material is applied to the surface of the sheet in accordance with the predetermined pattern.

In accordance with a variation of the first embodiment of the invention, the rubber masking material is applied uniformly across the entire surface of the glass or plastic sheet. After the rubber masking material has set, the predetermined pattern is established in the rubber masking material by removing selected portions of the rubber masking material from the surface of the sheet. For example, a knife or similar tool may be utilized to separate selected portions of the layer of rubber masking material from the remainder of the layer, whereupon the selected portions may be peeled off of the surface of the glass or plastic sheet.

The rubber masking material requires about six hours to cure or set. Upon curing, the rubber masking material forms into a substantially solid rubber masking layer which is adhered to the surface of the glass or plastic sheet. In this manner the surface of the glass or plastic sheet is separated into at least one masked and at least one unmasked area, such areas being in accordance with the predetermined pattern. The masked and unmasked areas are subsequently rendered visually distinguishable.

In accordance with the first embodiment of the invention, the masked and unmasked areas on the surface of the glass or plastic sheet are rendered visually distinguishable by means of sandblasting. As used herein the term sandblasting means impinging on the surface of the glass or plastic sheet having the rubber masking layer thereon a high velocity stream of particulate material, including materials not strictly definable as sand. The various parameters of the sandblasting step, including the selection of the particulate material employed, the velocity of the particulate stream, the separation between the particulate material stream discharge orifice and the surface of the sheet, and the length of the time during which the particulate stream is impinged on the surface of the glass or plastic sheet, depend on the nature of the glass or plastic sheet and on the extent to which it is desired to render the masked and unmasked areas of the surface of the sheet visually distinguishable one from the other. By way of example, the time duration during which the stream of particulate material is impinged on the surface of the sheet may be about one quarter ($\frac{1}{4}$) hour per 24 square feet of sheet surface area.

Following the sandblasting step, the substantially solid rubber masking layer is removed from the surface of the glass or plastic sheet. This may be accomplished by simply peeling the rubber masking layer away from the surface. Preferably, however, a high velocity stream of water or the like is employed to remove the rubber masking layer from the surface of the sheet. Following the rubber masking layer removal step the glass or plastic sheet is dried, whereupon the sheet is completed and is ready for installation.

An important aspect of the invention comprises the fact that the foregoing steps of applying the rubber masking material in accordance with a predetermined pattern, curing the rubber masking material to form a rubber masking layer, sandblasting the surface having the rubber masking layer thereon, and subsequently removing the rubber masking layer may be repeated in order to form a dual density visual image on the surface of the glass or plastic sheet. Typically, the second application of the rubber masking material is in accordance with a different pattern than the first application. In this manner the surface of the sheet may be divided into areas that have not been sandblasted at all, areas that have been more lightly sandblasted, and areas that have been more heavily sandblasted. Further gradations of the sandblasting effect may be achieved by continued repetition of the several steps comprising the first embodiment of the invention.

The first embodiment of the invention is further illustrated in FIGS. 2, 3, 4 and 5. A frame 10 is hingedly supported on a table 12. A screen 14 having a predetermined pattern formed therein by conventional techniques is mounted in the frame 10. A counterbalance system 15 is utilized to facilitate raising and lowering the frame 10 and the screen 14 carried thereby.

The frame 10 is initially raised and a glass or plastic sheet is positioned under the screen 14. Locating structure may be employed to precisely position the glass or plastic sheet relative to the pattern on the screen 14. Thereafter the frame 10 is lowered and a quantity of rubber masking material 16 is deposited on the screen 14. A squeeqee 18 is then employed to force the rubber masking material through the appropriate areas of the screen 14 onto the adjacent surface of the glass or plastic sheet. The squeegee 18 is supported by structure 20 for movement along the table 12 in the direction indicated by the arrow 22. Referring to FIG. 3, the foregoing steps are utilized to apply the rubber masking material to the surface of the glass or plastic sheet in accordance with a predetermined pattern. FIG. 3 illustrates a glass or plastic sheet 24 having a layer of rubber masking material 26 formed thereon in accordance with the pattern of the screen 14 as illustrated in FIG. 2. After the rubber masking material has been applied to the surface of the glass or plastic sheet the screen 14 is raised and the glass or plastic sheet is removed from the table 12. The rubber masking material on the glass or plastic sheet is thereafter allowed to cure thereby forming a substantially solid rubber masking layer corresponding to the predetermined pattern on the surface of the sheet.

Referring to FIG. 4, after the layer of rubber masking material on the surface of the glass or plastic sheet has cured, the surface of the glass or plastic sheet having the rubber masking material thereon is sandblasted. A conduit 28 extends from a source of high velocity air having particulate material entrained therein. The conduit 28 extends to a discharge nozzle 30 positioned over a table 32 having a glass or plastic sheet 34 positioned thereon. The nozzle 30 is positioned a predetermined distance from the surface of the glass or plastic sheet 34 having the rubber masking material thereon, whereby the nozzle 30 functions to impinge a high velocity stream of particulate material on the surface of the sheet 34. A mechanism 36 is utilized to oscillate the nozzle 30 about a vertical axis in the direction indicated by the arrow 38, and the table 32 is simultaneously employed to rotate the sheet 34 about a vertical axis in the direction indicated by the arrow 40. In this manner the high velocity stream of particulate material flowing from the nozzle 30 is applied uniformly to the entire surface of the sheet 34.

Figure 5:
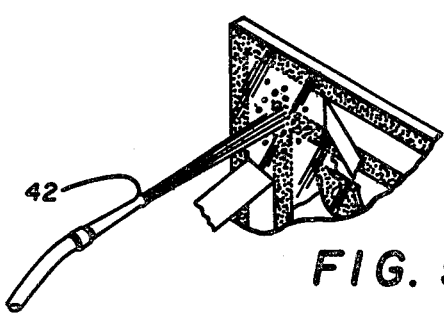
Figure 6:
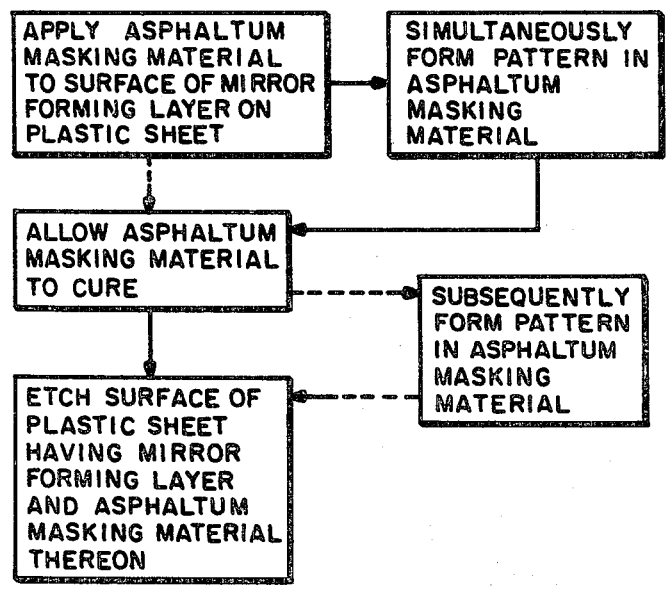
FIG. 6 is a flow chart illustrating a method of making decorative panels comprising a second embodiment of the invention.

Following the sandblasting step the rubber masking layer is removed from the surface of the glass or plastic sheet. As is illustrated in FIG. 5, this is preferably accomplished utilizing a high velocity water stream emanating from a nozzle 42. Such a water stream is effective to quickly and efficiently remove the rubber masking layer from the surface of the glass or plastic sheet. It will be understood that other techniques for removing the rubber masking layer may also be utilized in the practice of the invention.

Figure 7:
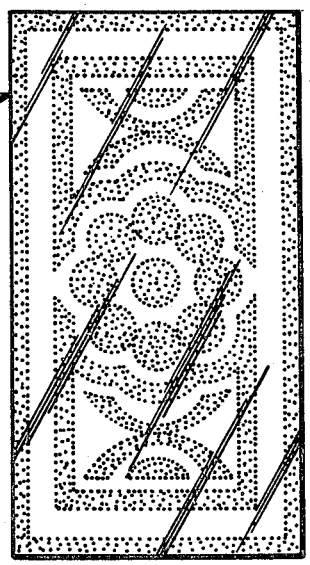
FIGS. 7 and 8 are illustrations of decorative panels made in accordance with the method of the invention.
Figure 8:
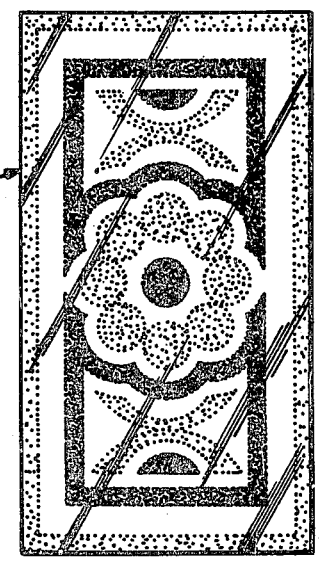

FIG. 7 illustrates a panel 44 made in accordance with the method of making decorative panels comprising the present invention. Panels made in accordance with the invention have the appearance of etched glass panels, but are considerably more economical to manufacture than are panels made in accordance with prior art glass etching techniques. FIG. 8 illustrates a panel 46 similar to the panel 44 but having a dual density visual effect. As has been described hereinabove, such a dual density visual effect may be accomplished by applying a second layer of rubber masking material, curing the second rubber masking layer, and resandblasting the surface of the glass or plastic panel having the rubber masking layer thereon.

FIG. 8 illustrates a method of forming decorative panels incorporating a second embodiment of the invention. The method of forming decorative panels comprising the second embodiment of the invention is applicable to sheets of plastic material having mirror forming layers thereon. For example, the type of plastic material sold by Rohm & Haas Co. under the trademark "PLEXIGLASS" is commercially available having a mirror forming layer applied to one surface thereof.

In accordance with the second embodiment of the invention, a layer of asphaltum masking material is applied to the surface of the mirror forming layer on the sheet of plastic material. Preferably, the asphaltum masking layer is applied to the surface of the mirror forming layer in accordance with a predetermined pattern. This may be accomplished by applying the asphaltum masking material to the surface of the mirror forming layer through a screen having the predetermined pattern formed therein. Such a screen may be prepared utilizing techniques which are identical to those utilized to form screens for silk screen-type printing.

In accordance with a variation of the second embodiment of the invention, a layer of asphaltum masking material is applied uniformly across the surface of the mirror forming layer on the plastic sheet and is cured. Portions of the asphaltum masking layer are subsequently removed from the surface of the mirror forming layer in order to form the predetermined pattern therein. For example, portions of the asphaltum masking layer may be removed utilizing a knife or similar tool.

After the asphaltum masking material has been applied to the surface of the mirror forming layer on the plastic sheet it is allowed to cure. The length of time that is required in order to cure the asphaltum masking material depends on the thickness of the asphaltum masking layer and the nature of the particular asphaltum material that is employed. Typically about two hours is required in order to cure the asphaltum masking material in air at room temperature. Upon curing, the asphaltum masking material forms a solid asphaltum masking layer on the surface of the mirror forming layer on the plastic sheet which differentiates the mirror forming layer into at least one masked and at least one unmasked area. The masked and unmasked areas are in accordance with the predetermined pattern.

The next step in the second embodiment of the invention comprises rendering the masked and unmasked areas of the mirror forming layer on the plastic sheet visually distinguishable one from the other. This is accomplished by an application of etching material, whereby the mirror forming layer in the unmasked areas is removed from the surface of the plastic sheet. Although various etching materials may be employed, it has been found that sodium hydroxide may advantageously be employed as an etching material. Following the etching step, the sheet of plastic material having the mirror forming layer thereon is sprayed with silver paint so that the paint covers at least the etched areas and the etching material. At this point the sheet is completed, and may then be installed.

An important aspect in the second embodiment of the invention involves the fact that the asphaltum masking material is adapted to be applied to the mirror forming layer in accordance with a very high degree of resolution. This permits the use of the second embodiment of the invention to form very high resolution visual effects, such as half toning, and the like.

The use of the second embodiment of the invention forms a plastic panel having mirrored and transparent areas in accordance with the predetermined pattern. In this manner decorative panels similar in appearance to etched or frosted glass mirrored panels are formed. However, by means of the second embodiment of the invention such panels are formed considerably more economically than is possible in accordance with prior art techniques.

From the foregoing, it will be understood that the present invention comprises a method of making decorative panels which incorporates numerous advantages over the prior art. Perhaps the most important advantage deriving from the use of the invention involves the fact that panels formed in accordance therewith may be manufactured considerably more economically than is possible utilizing prior art techniques. Another advantage deriving from the use of the invention involves the fact that decorative panels may be formed from either glass or plastic panels. Other advantages deriving from the use of the invention will readily suggest themselves to others skilled in the art.

Although particular embodiments of the invention have been illustrated in the accompanying Drawings and described in the foregoing Detailed Description, it will be understood that the present invention is not limited to the embodiments disclosed, but is capable of numerous rearrangements, substitutions, and modifications of parts and elements without departing from the spirit of the invention.

What is claimed is:

1. A method of making decorative panels comprising:
    forming a predetermined pattern in a screen by covering the screen with a photosensitive emulsion, exposing the photosensitive emulsion photographically and developing the exposed photosensitive emulsion such that a portion of the screen corresponding to the image of the photograph will permit the passage of liquid therethrough;
    positioning the screen adjacent a panel with the pattern in the screen adjacent a surface of the panel;
    applying liquid elastomeric masking material to the surface of the panel through the screen and thereby applying the liquid elastomeric material to the surface of the panel in accordance with the pattern on the screen;
    curing the liquid elastomeric masking material on the surface of the panel and thereby forming a substantially solid masking layer on the surface of the panel in accordance with the predetermined pattern;
    impinging a high velocity stream of particulate material onto the surface of the panel having the masking layer thereon and thereby visually differentiating the unmasked portion of the surface of the panel from the masked portions thereof; and
    subsequently removing the masking layer to provide a panel having visually differentiated areas corresponding to the previously masked and the previously unmasked portions of the surface of the panel.

2. The method of making decorative panels according to claim 2 further characterized by repeating the liquid elastomeric masking material applying, curing, and particulate material impinging steps utilizing a different predetermined screen pattern and thereby forming a panel having a dual density pattern thereon.

3. A method of making decorative panels comprising:
    forming a predetermined pattern in a substantially liquid impervious screen to permit the passage of liquid through the pattern;
    positioning the screen adjacent a panel with the pattern in the screen adjacent a surface of the panel;
    applying liquid elastomeric masking material to the surface of the panel through the screen and thereby applying the liquid elastomeric material to the surface of the panel in accordance with the pattern on the screen;
    curing the liquid elastomeric masking material on the surface of the panel and thereby forming a substantially solid masking layer on the surface of the panel in accordance with the predetermined pattern;
    impinging a high velocity stream of particulate material onto the surface of the panel having the masking layer thereon and thereby visually differentiating the unmasked portion of the surface of the panel from the masked portions thereof; and
    subsequently removing the masking layer to provide a panel having visually differentiated areas corresponding to the previously masked and the previously unmasked portions of the surface of the panel.

* * * * *

UNITED STATES PATENT AND TRADEMARK OFFICE
CERTIFICATE OF CORRECTION

PATENT NO. : 4,133,919
DATED : January 9, 1979
INVENTOR(S) : Robert C. Parsons

It is certified that error appears in the above—identified patent and that said Letters Patent are hereby corrected as shown below:

Column 8, line 14, change "2" to --1--.

Signed and Sealed this

Twenty-ninth Day of May 1979

[SEAL]

Attest:

RUTH C. MASON
Attesting Officer

DONALD W. BANNER
Commissioner of Patents and Trademarks